(12) United States Patent
Hamoudi et al.

(10) Patent No.: US 11,228,009 B2
(45) Date of Patent: Jan. 18, 2022

(54) MOLECULAR BOTTOM-UP METHODS FOR FABRICATING PEROVSKITE SOLAR CELLS, PEROVSKITE MATERIALS FABRICATED THEREOF, AND OPTOELECTRONIC DEVICES INCLUDING SAME

(71) Applicant: Qatar Foundation for Eduction, Science and Community Development, Doha (QA)

(72) Inventors: Hicham Hamoudi, Doha (QA); Golibjon Berdiyorov, Doha (QA)

(73) Assignee: QATAR FOUNDATION FOR EDUCATION, SCIENCE AND COMMUNITY DEVELOPMENT, Doha (QA)

( * ) Notice: Subject to any disclaimer, the term of this patent is extended or adjusted under 35 U.S.C. 154(b) by 0 days.

(21) Appl. No.: 16/561,528

(22) Filed: Sep. 5, 2019

(65) Prior Publication Data

US 2021/0074938 A1 Mar. 11, 2021

(51) Int. Cl.

| | |
|---|---|
| *H01L 51/42* | (2006.01) |
| *H01L 51/44* | (2006.01) |
| *H01L 51/00* | (2006.01) |
| *H01G 9/20* | (2006.01) |
| *C30B 7/14* | (2006.01) |
| *C30B 29/12* | (2006.01) |

(Continued)

(52) U.S. Cl.
CPC ............ *H01L 51/4213* (2013.01); *C30B 7/14* (2013.01); *H01G 9/20* (2013.01); *H01L 51/0002* (2013.01); *H01L 51/441* (2013.01); *H01L 51/444* (2013.01); *C07F 7/24* (2013.01); *C30B 29/12* (2013.01); *C30B 29/602* (2013.01)

(58) Field of Classification Search
CPC . H01L 51/4213; H01L 51/441; H01L 51/444; H01G 9/20
See application file for complete search history.

(56) References Cited

U.S. PATENT DOCUMENTS

2017/0152608 A1* 6/2017 Jin ..................... H01L 51/005

FOREIGN PATENT DOCUMENTS

WO WO-2017160955 A1 * 9/2017 ........... H01L 51/442

OTHER PUBLICATIONS

Hamoudi, et al.; "On the self assembly of short chain alkanedithiols"; from the Journal of Physical Chemistry Chemical Physics; Issue 45; 2008; (2 pages).

(Continued)

*Primary Examiner* — Lindsey A Bernier
(74) *Attorney, Agent, or Firm* — K&L Gates LLP

(57) ABSTRACT

Disclosed is a building blocks method for low-cost fabrication of single crystal organometallic perovskite materials with pseudo crystallized hole transporting material layer. This method uses self-assembled molecular monolayers SAM as building blocks. This approach enables creation of defect-free perovskite crystals with desired morphology and crystallinity in a controlled way. Additionally, the cross-linked molecular layers SAM play a role of hole transporting materials HTM and encapsulation against diffusion of metal atoms and gas molecules, thus enhancing the stability of the perovskite materials. This method is cost effective and can be scaled up.

3 Claims, 5 Drawing Sheets

(51) Int. Cl.
    *C30B 29/60* (2006.01)
    *C07F 7/24* (2006.01)

(56) References Cited

OTHER PUBLICATIONS

Li, et al; Metal Halide Perovskite Single Crystals: From Growth Process to Application; May 17, 2018; www.mdpi.com/journal/crystals; (22 pages).

* cited by examiner

SAM on gold substrate

Deposition of Pb-X₃ layer

Deposition of top electrode

Deposition of MAPbX₃

MOLECULAR BOTTOM-UP METHODS FOR FABRICATING PEROVSKITE SOLAR CELLS, PEROVSKITE MATERIALS FABRICATED THEREOF, AND OPTOELECTRONIC DEVICES INCLUDING SAME

BACKGROUND

Organic-inorganic hybrid perovskites, such as methylammonium (MA) lead iodide (MAPbI), have emerged as potential candidates for solar energy conversion and light-emission applications. The excellent light harvesting performance of perovskite materials is related to the long carrier diffusion length, high mobility of charge carriers, low exciton binding energy, and optimum band alignment for strong photon absorption across most of the optical spectrum.

Perovskite solar cells can be created using low-temperature solution processing methods, which reduce the manufacturing cost considerably. However, conventional fabrication methods of organometallic perovskites, solution processing and direct evaporation, result in the formation of different topological defects, such as vacancy defects and dislocations, which ultimately limits the performance of perovskite-based devices. Other methods such as spin-coating are also used in creating such heterojunctions. These methods result in non-uniform film thickness and disordered morphology, which in turn affect structural features and optoelectronic properties of the material. In addition, these methods have poor scalability for large-scale production. Another defect of these conventional methods is reduced stability of the resultant perovskite materials due to, for example, residual gas and/or water produced during the fabrication process.

Some solution-based methods of growing single-crystal perovskite structures have been reported. However, in these methods, the size, shape, and growth rate of the perovskite material cannot be controlled.

SUMMARY

According to one non-limiting aspect of the present disclosure, a method for fabricating a device based on perovskite includes providing a metal substrate; forming a self-assembled molecular monolayer (SAM) on top of the metal substrate; and forming the perovskite material on top of the self-assembled molecular monolayer. Forming the self-assembled molecular monolayer comprises immersing the metal substrate in a first solution comprising self-assembly molecules. The molecules are terminated with sulfur and ammonia. The first solution comprises n-hexane with thiol- and amine-end groups. The metal substrate is exposed to electron or UV radiation to crosslink the self-assembly molecules. Forming the perovskite material comprises immersing the metal substrate with the self-assembled molecular monolayer in a second solution comprising a first metal halide to form a metal-halide layer as a perovskite active layer on top of the self-assembled molecular monolayer, the first metal halide comprising a metal selected from the group consisting of lead (Pb), tin (Sn), bismuth (Bi), antimony (Sb), germanium (Ge), and combinations thereof, and the first metal halide further comprising a halogen selected from the group consisting of Cl, Br, I, and combinations thereof. The self-assembly molecules are terminated with one or both of sulfur and ammonia, and the one or both of sulfur and ammonia end groups interact with halide ions in the second solution to form uniform crystallization of the single lead-halide layer. The substrate with the single lead-halide layer on top of the self-assembled molecular monolayer is immersed in a third solution comprising a second metal halide and methyl ammonium iodide (MAI) to grow the perovskite material on top of the self-assembled molecular monolayer, the second metal halide comprising a metal selected from the group consisting of lead (Pb), tin (Sn), bismuth (Bi), antimony (Sb), germanium (Ge), and combinations thereof, and the second metal halide further comprising a halogen selected from the group consisting of Cl, Br, I, and combinations thereof.

According to another non-limiting aspect of the present disclosure, a perovskite device includes a metal substrate; a self-assembled molecular monolayer on top of the metal substrate; a perovskite material on top of the self-assembled molecular monolayer; and an electron-collector electrode deposited on top of the perovskite material. The self-assembled molecular monolayer comprises crosslinked self-assembly molecules terminated with one or both of sulfur and ammonia. The perovskite film comprises a single-crystal layer of MAPbX, where X is one or more of Cl, Br, and I. The metallic substrate can be made of gold, silver, copper, platinum, zinc, nickel, graphene, iron, carbon-nanotube (CNT) or aluminum.

According to another non-limiting aspect of the present disclosure, a method of manufacturing a solar cell includes providing a metal substrate; forming a self-assembled molecular monolayer on top of the metal substrate; forming the perovskite material on top of the self-assembled molecular monolayer; and depositing an electron-collector electrode on top of the perovskite material. Forming the self-assembled molecular monolayer comprises immersing the metal substrate in a first solution comprising self-assembly molecules. The self-assembly molecules are terminated with one or both of sulfur and ammonia. The first solution comprises n-hexane with thiol- and amine-end groups. The metal substrate is exposed to electron or UV radiation to crosslink the self-assembly molecules. Forming the perovskite material comprises immersing the metal substrate with the self-assembled molecular monolayer in a second solution comprising a metal halide to form a single metal-halide layer as a perovskite active layer on top of the self-assembled molecular monolayer, the metal halide comprising a metal selected from the group consisting of lead (Pb), tin (Sn), bismuth (Bi), antimony (Sb), germanium (Ge), and combinations thereof, and the metal halide further comprising a halogen selected from the group consisting of Cl, Br, I, and combinations thereof.

BRIEF DESCRIPTION OF DRAWINGS

Features and advantages of the methods for fabricating perovskite materials, the perovskite materials fabricated thereof, and optoelectronic devices including same described herein may be better understood by reference to the accompanying figures in which:

FIG. 1(a) shows a substrate immersed in a solution containing n-hexane molecules with one or both of thiol- and amine-end groups. FIG. 1(b) shows a SAM formed on the surface of the substrate through the interaction between the thiol- or amine-end groups and the surface of the substrate.

FIG. 2(a) shows the substrate with SAM formed in FIG. 1(b) immersed in a solution of PbX$_2$, where X is one or more of Cl, Br, and I. FIG. 2(b) shows a single layer of uniform lead-halide crystallization on top of the SAM.

FIG. 3(a) shows the resultant sample from FIG. 2(b) immersed in a solution containing PbX$_2$ and methyl ammonium iodide (MAI). FIG. 3(b) shows a halide perovskite material grown on the surface of the SAM.

FIG. 4(a) shows a SAM on gold substrate as formed in FIGS. 1(a)-1(b). FIG. 4(b) shows deposition of Pb—X$_3$ layer as illustrated in FIGS. 2(a)-2(b). FIG. 4(c) shows deposition of MAPbX$_3$ as illustrated in FIGS. 3(a)-3(b). FIG. 4(d) shows deposition of a top electrode as illustrated in FIGS. 4(a)-4(d).

Figure 1A:
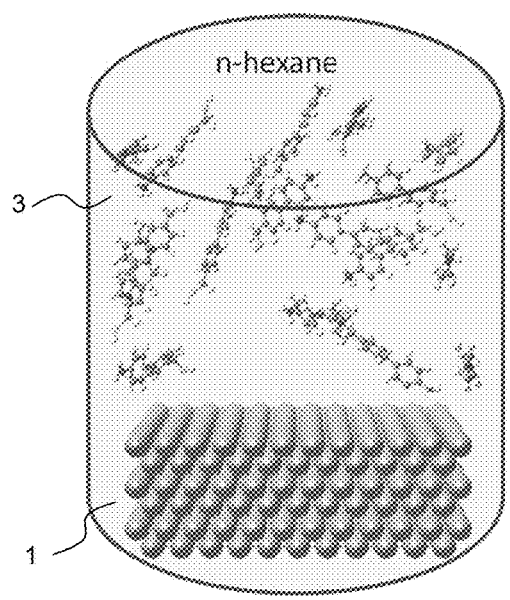
FIGS. 1(a)-1(b) illustrate the process of creating a SAM of one or both of thiol- and amine-group molecules on a gold substrate.

The reader will appreciate the foregoing details, as well as others, upon considering the following detailed description of certain non-limiting embodiments of the present technology including methods for fabricating perovskite materials, the perovskite materials fabricated thereof, and optoelectronic devices including same according to the present disclosure.

DETAILED DESCRIPTION

The present disclosure relates to a cost-effective method of fabricating defect-free, single crystal perovskite materials for applications in photovoltaics and other optoelectronic devices, for example, light-emitting diodes. The disclosed method can be used to fabricate hole transporting materials (HTMs) made from metal-halide perovskite materials. The perovskite materials and the HTMs fabricated by the present method have high crystallinity and desired morphology. The present method uses a molecular building blocks approach. The metal-halide perovskite material fabricated by the present method can have a single crystal structure.

The crystal structure is very important for the stability of a perovskite material, as detailed in M. I. Saidaminov, A. L. Abdelhady, B. Murali, E. Alarousu, V. M. Burlakov, W. Peng, I. Dursun, L. Wang, Y. He, G. Maculan, A. Goriely, T. Wu, O. F. Mohammed, and O. M. Bakr, Nature Communications 6, 7586 (2015). However, their method of creating perovskite single crystals suffer from scalability and thus difficult for large scale applications (e.g. solar cells).

The present method is advantageous over the conventional methods of making perovskite materials. For example, the present method is low cost and scalable. Large single-crystal metal-halide perovskites can be synthesized with phase purity and macroscopic dimensions on top of a metallic substrate. A self-assembled molecular monolayer (SAM) can replace the conventional, expensive and unstable organic hole transport materials (HTM), such as spiro-OMeTAD. The SAM can also prevent the penetration of metal atoms and gas molecules to the perovskite material.

Compared to existing perovskite solar cells, the perovskite solar cells including the perovskite materials fabricated by the present method have higher mechanical and operational stability, durability, and solar conversion efficiency. Further, these solar cells are cost effective as compared to conventional perovskite solar cells and silicon-based solar cells.

In the present method, highly ordered molecular SAMs are used to trigger and immobilize a single-crystal perovskite material on a substrate. The SAMs can serve as the HTM layer for applications in solar cells. As described in the following non-limiting examples, a solution-based approaches can be used to grow the perovskite material on top of the SAM formed on the surface of the substrate. However, other approaches can also be used. For example, evaporation-based approaches can also be used to grow the perovskite materials.

The present method is illustrated in the figures and described below.

According to some non-limiting aspects of the present disclosure, SAMs can be used for immobilizing and triggering uniform growth of a perovskite material on the surface of a metallic substrate. As shown in FIG. 1(a), self-assembly of molecular monolayers can be performed on a metallic substrate 1. The substrate 1 can be made of gold, silver, zinc, copper, platinum, nickel, iron, or aluminum. The SAM 2 can play the role of HTM. The molecules used for SAM 2 can be terminated by one or both of sulfur and amine end groups, which can result in a good contact of the SAMs with the substrate 1. For example, this stage can be performed using the process described in H. Hamoudi, Z. Guo, M. Prato, C. Dablemont, W. Q. Zheng, B. Bourguignon, M. Canepad and V. A. Esaulov, On the self-assembly of short chain alkanedithiols, Phys. Chem. Chem. Phys. 10, 6836-6841 (2008), which is fully incorporated herein by reference.

Figure 1B:
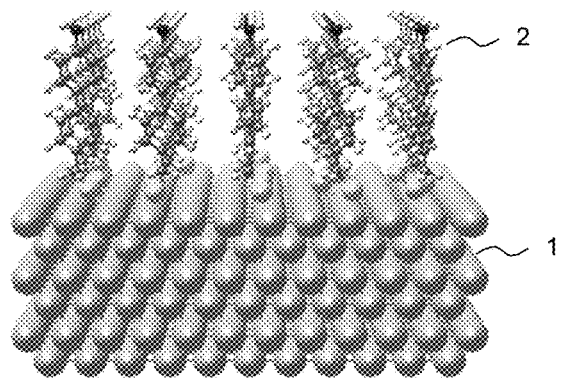

The substrate 1 can be first annealed using a butane/propane flame or in oven in temperature between 300° C. and 500° C. with intermediate cooling under N$_2$. The resulting substrate can be immersed into an organic solution from 1 h to 24 h. For example, as shown in FIG. 1(a), a solution containing n-hexane or ethanol molecules with one or both of thiol- and amine-end groups 3 can be used. As depicted in FIG. 1(b), highly ordered SAM 2 can form on the surface of the substrate 1 with the free-standing end groups that can be one or both of sulfur and ammonium. The SAM 2 can form the hole transport (HTM) layer used in solar cells. After the immobilization of the SAM 2, the sample can be exposed to electron or UV radiation to crosslink the molecules to form a stable HTM layer.

The molecules used for SAMs can serve as the HTM after the crosslinking processes, which play a crucial role in solar energy harvesting using perovskite solar cells. The HTM formed using the present method can be much cheaper and more stable than the conventional HTM materials such as Spiro-OMeTAD.

Figure 2A:
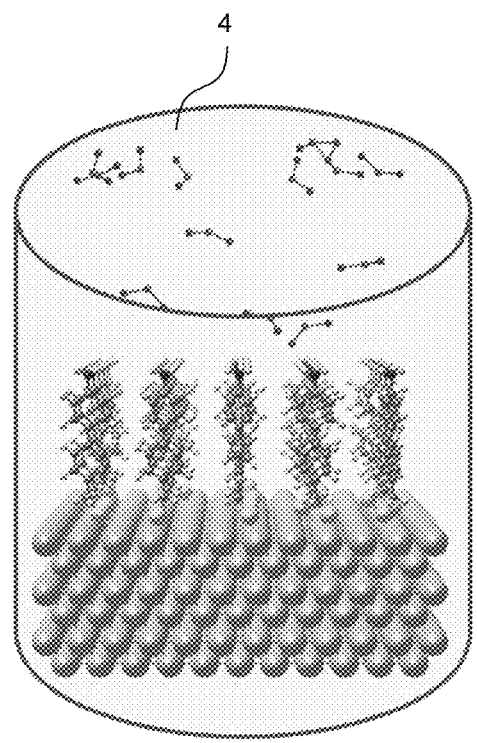
FIGS. 2(a)-2(b) illustrate the formation of a Pb—I layer on top of the SAM after immersing the sample in the solution with $PbX_2$.
Figure 2B:
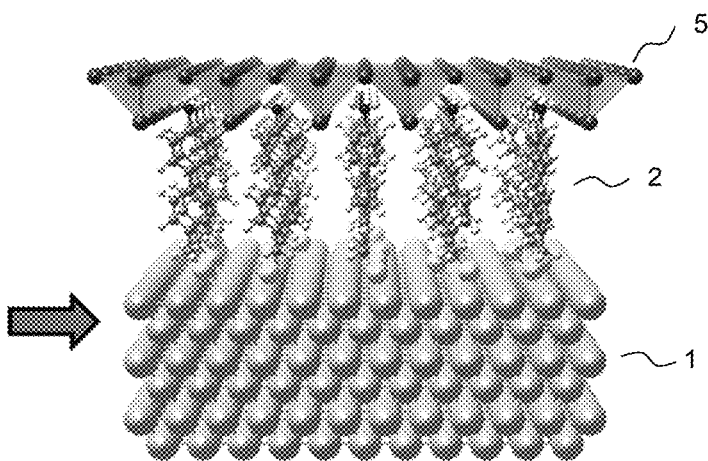

As shown in FIG. 2(a), the substrate with SAM formed as described above can be immersed into a solution of a metal halide. The metal can be lead, non-lead, or lead-free. The metal can be selected from the group consisting of lead (Pb), tin (Sn), bismuth (Bi), antimony (Sb), germanium (Ge), and combinations thereof. For example, the metal halide can be PbX$_2$, where X is one or more of Cl, Br, and I. The metal halide can also be a low-toxicity lead-free (Pb-free) metal halide, where the metal can be selected from the group consisting of tin (Sn), bismuth (Bi), antimony (Sb), germanium (Ge), and combinations thereof. Due to the interaction of one or both of the thiol- and amine-end groups of the molecules with the halide ions, a single layer of uniformly crystallized lead-halide 5 can be obtained, as shown in FIG. 2(b). This layer can be a base for the growth of the perovskite monocrystal material as described below.

Figure 3A:
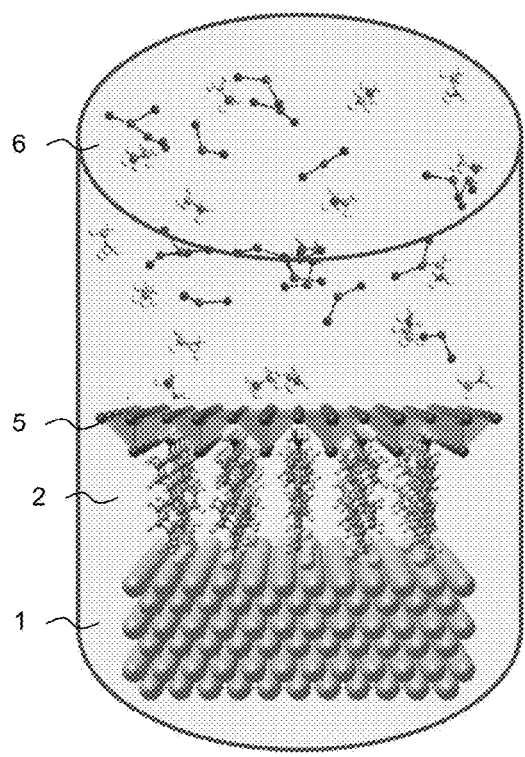
FIGS. 3(a)-3(b) illustrate the formation of perovskite monocrystals.
Figure 3B:
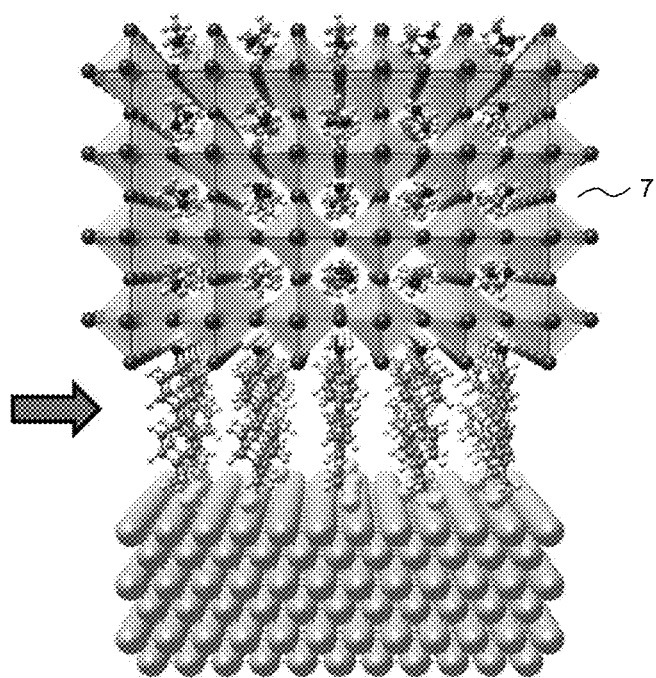

As shown in FIG. 3(a), the resultant sample from FIGS. 2(a)-2(b) can be immersed in a solution 6 containing a metal halide and methyl ammonium iodide (MAI) for the growth of the organometallic halide perovskite material 7 on top of the single layer of uniformly crystallized lead-halide 5. The immersion can last from 1 h to 5 h. In the metal halide, the metal can be lead, non-lead, or lead-free. The metal can be selected from the group consisting of lead (Pb), tin (Sn), bismuth (Bi), antimony (Sb), germanium (Ge), and combinations thereof. For example, the metal halide can be $PbX_2$, where X is one or more of Cl, Br, and I. The metal halide can also be a low-toxicity lead-free (Pb-free) metal halide, where the metal can be selected from the group consisting of tin (Sn), bismuth (Bi), antimony (Sb), germanium (Ge), and combinations thereof. One or both of the sulfur and ammonium end groups of the SAM can assure the grafting of the $PbX_2$ or the Pb-free and the formation of a large-scale crystal of MAPbx on top of the SAM. The resultant single crystal perovskite materials are more stable than existing polycrystalline perovskites.

Figure 4A:
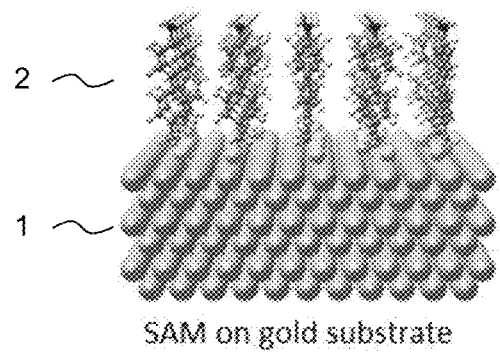
FIGS. 4(a)-4(d) illustrate the molecular building-block fabrication process for a single-crystal metal-halide perovskite device.
Figure 4B:
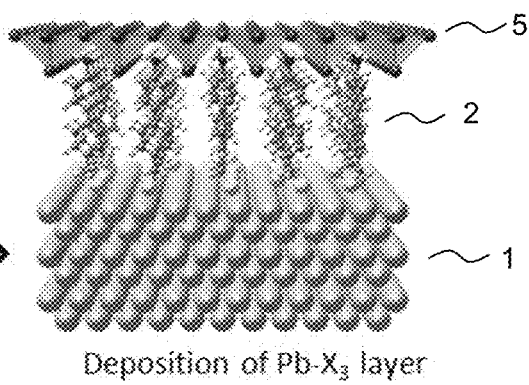
Figure 4D:
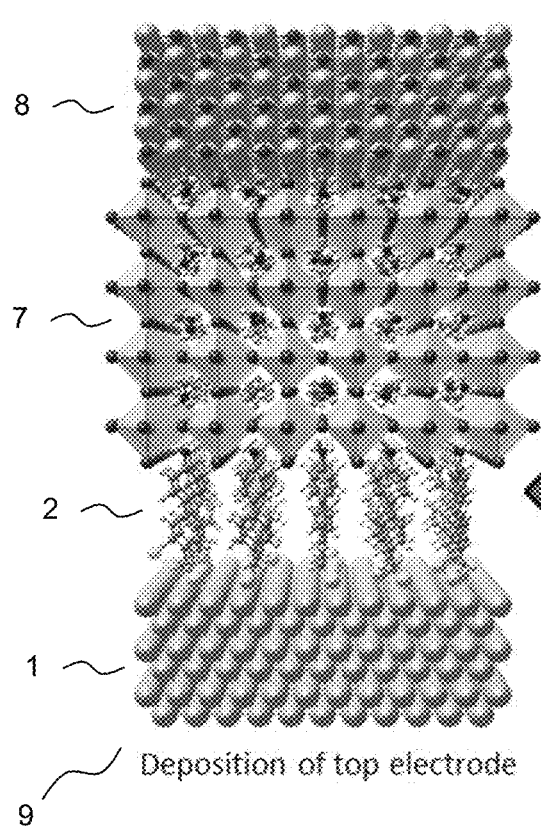
Figure 4C:
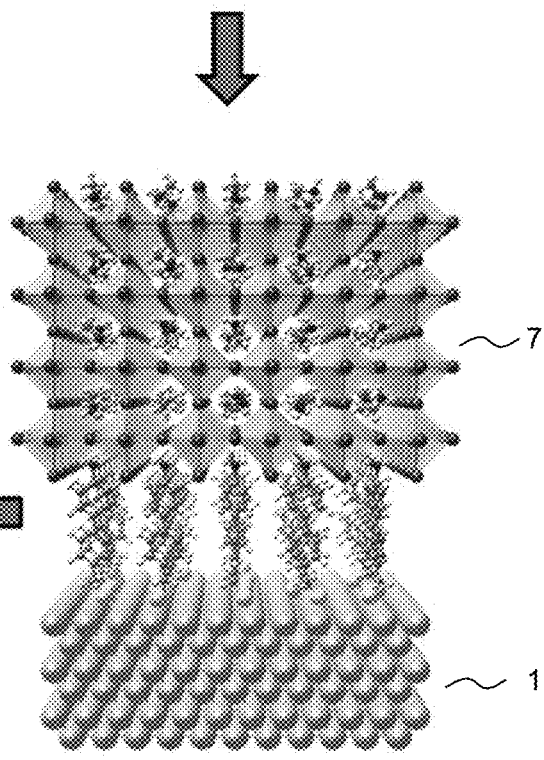

To make a perovskite device 9, an electron-collector electrode 8 can be deposited by evaporation on top of the perovskite material 7, as shown in FIG. 4(d). The electron-collector electrode can include $TiO_2$ or $Al_2O_3$. The electron-collector electrode 8 (top electrode) can include an electron conducting material, such as indium-tin oxide (ITO).

Compared to other fabrication methods, such as spin-coating approaches, the present method can be scaled up. Additionally, the resultant perovskite material does not need to be transferred as the material is grown directly on the substrate. The present method can also extend to other optoelectronic devices, such as light-emitting diodes LED.

Figure 5:
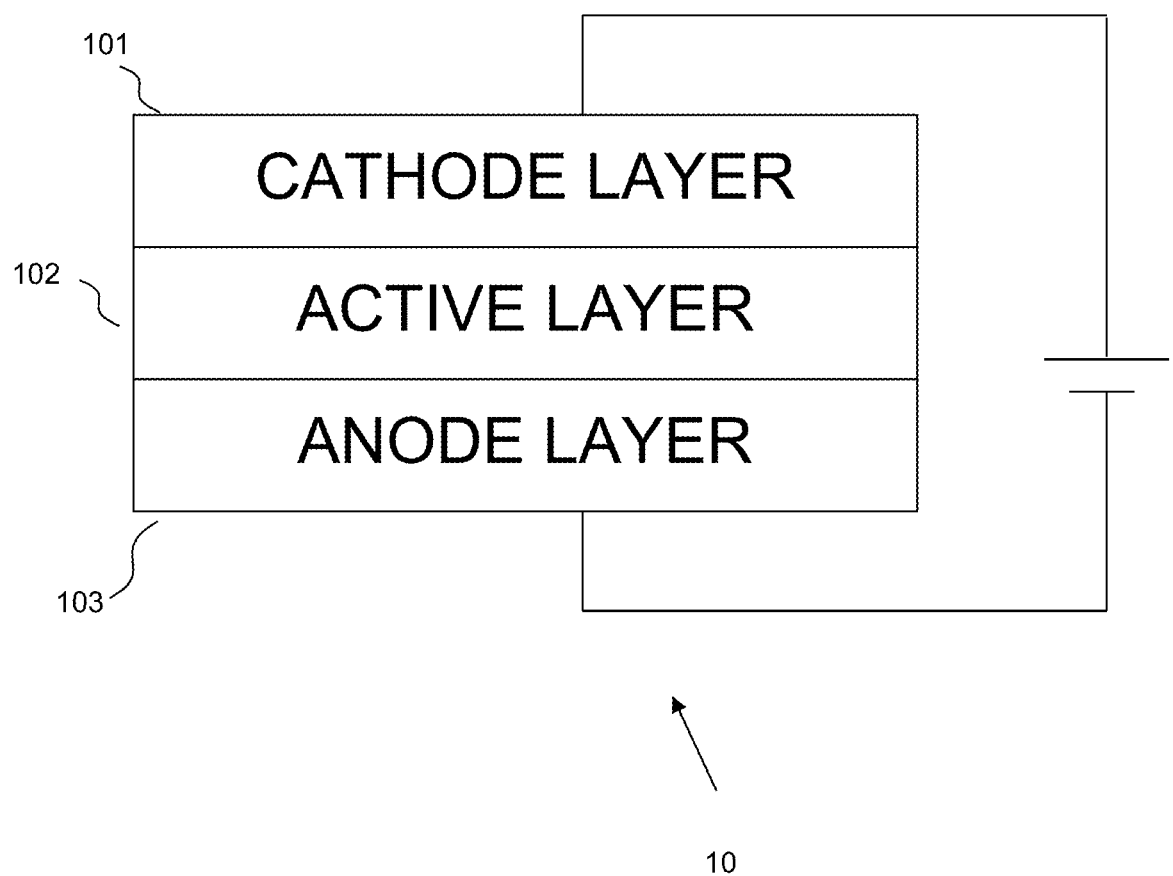
FIG. 5 is a cross section side view illustrating an embodiment of a semiconductor device.

FIG. 5 illustrates one implementation of the structure and operating principle of a semiconductor device 10. In implementations, a semiconductor device 10 can include, but are not limited to, optoelectronic devices such as solar cells, photocatalysts, photoelectrodes, light-emitting diodes, photoelectrodes, and so forth. As shown in FIG. 5, the semiconductor device 10 may include a cathode layer 101, an anode layer 103, and an active layer 102 disposed between the cathode layer 101 and the anode layer 103. The cathode layer 101 functions as a cathode electrode. The anode layer 103 can include an anode electrode.

In some specific embodiments, the cathode layer 101 can include one or both of an Al layer and a Ag layer that functions as a cathode, and the anode layer 103 can include an indium-tin oxide (ITO) layer that functions as an anode. In other specific embodiments, the cathode layer 101 can include an ITO layer that functions as a cathode. For example, the top electrode 8 as described above can function as the cathode. The anode layer 103 can include an aluminum layer that functions as an anode. Other materials may also be used to form the cathode layer 101, such as one or more of calcium, magnesium, lithium, sodium, potassium, strontium, cesium, barium, iron, cobalt, nickel, copper, silver, zinc, tin, samarium, ytterbium, chromium, gold, graphene, CNT, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, and a combination of two or more of the above materials. Further, other materials may be used to form the anode layer 103 (or a transparent electrode), such as fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene. The active layer 102 can include the perovskite material 7 as fabricated using the method described in the above examples.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A perovskite device comprising:
a substrate comprising a metallic material;
a cross-linked self-assembled molecular monolayer on top of the substrate;
a perovskite material on top of the cross-linked self-assembled molecular monolayer, wherein the perovskite material is grown on the cross-linked self-assembled molecular monolayer to create uniform and defect free perovskite single crystal; and
an electron-collector electrode deposited on top of the perovskite material,
wherein the cross-linked self-assembled molecular monolayer comprises crosslinked self-assembly molecules terminated with sulfur
wherein the cross-linked self-assembled molecular monolayer functions as a hole transporting layer so that the perovskite device operates without a separate organic hole transport layer.

2. The perovskite device of claim 1, wherein the perovskite material comprises a single-crystal layer of $MAPbX_3$, where X is Cl, Br, or I.

3. The perovskite device of claim 1, wherein the substrate comprises a material selected from the group consisting of gold, silver, copper, platinum, zinc, nickel, graphene, iron, carbon-nanotube, aluminum, and combinations thereof.

* * * * *